(12) United States Patent
Kim et al.

(10) Patent No.: US 7,013,413 B1
(45) Date of Patent: Mar. 14, 2006

(54) METHOD FOR COMPRESSING OUTPUT DATA AND A PACKET COMMAND DRIVING TYPE MEMORY DEVICE

(75) Inventors: Sung Wook Kim, Seoul (KR); In Hong Kim, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 783 days.

(21) Appl. No.: 09/604,086

(22) Filed: Jun. 27, 2000

(30) Foreign Application Priority Data

Jun. 28, 1999 (KR) .................................. 99-24581

(51) Int. Cl.
*G11C 29/00* (2006.01)

(52) U.S. Cl. .................. 714/719; 714/48; 714/824

(58) Field of Classification Search ............... 714/719, 714/718, 723, 25, 42, 48
See application file for complete search history.

(56) References Cited

U.S. PATENT DOCUMENTS

| | | | | |
|---|---|---|---|---|
| 5,386,392 A | * | 1/1995 | Cantiant et al. | ............ 365/233 |
| 5,495,486 A | * | 2/1996 | Gheewala | .................... 714/724 |
| 5,910,921 A | * | 6/1999 | Beffa et al. | ................. 365/201 |
| 5,946,245 A | * | 8/1999 | Brown et al. | ................ 365/201 |
| 6,032,274 A | * | 2/2000 | Manning | ..................... 714/718 |
| 6,356,975 B1 | * | 3/2002 | Barth et al. | ................. 711/105 |
| 6,519,719 B1 | * | 2/2003 | Manning | ..................... 714/42 |
| 6,530,045 B1 | * | 3/2003 | Cooper et al. | ............. 714/719 |
| 6,671,836 B1 | * | 12/2003 | Lai et al. | ..................... 714/718 |
| 6,810,449 B1 | * | 10/2004 | Barth et al. | ................... 710/61 |

FOREIGN PATENT DOCUMENTS

| | | |
|---|---|---|
| JP | 06231073 | 8/1994 |
| JP | 07271628 | 10/1995 |
| JP | 10063533 | 3/1998 |
| JP | 10289600 | 10/1998 |
| JP | 11025696 | 1/1999 |

\* cited by examiner

*Primary Examiner*—Guy Lamarre
*Assistant Examiner*—John P. Trimmings
(74) *Attorney, Agent, or Firm*—Pillsbury Winthrop Shaw Pittman LLP

(57) ABSTRACT

The present invention relates to a packet command driving type memory device, a method for compressing output data according to the present invention is characterized to write first data of a certain bit in a corresponding address of core cell regions, read the first data of a certain bit written in the address, compare the written data and the read data by dividing it to an upper certain bit and a lower certain bit, generate compressed data of 1 bit with an information about whether a fail is.

8 Claims, 8 Drawing Sheets

S_DATEST

CBSEL
CADRy

COLLAT

COLCYC

FIG. 7E
TestWrite
FIG. 7F
TestDSTB 
FIG. 7G
TestClkR 
FIG. 7H
DQiPAD 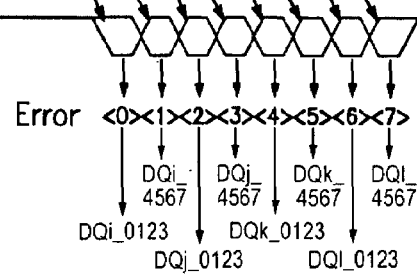

METHOD FOR COMPRESSING OUTPUT DATA AND A PACKET COMMAND DRIVING TYPE MEMORY DEVICE

BACKGROUND OF THE INVENTION

1. Field of the Invention

The present invention relates to a packet command driving type memory device, particularly, to a method for compressing output data that can reduce test time and determine an exact position where a memory failure occurs and a memory device having a pre-fetched data output structure.

2. Description of Related Art

In a prior packet command driving type memory device, e.g., a memory device such as a RAMBUS DRAM, a data pass structure is depicted in FIG. 1. FIG. 2 shows details of part A (a dotted line part) of FIG. 1, with data passing through from a core cell region 10 to an output pad DQ.

During a write operation, individual data bits are transferred to an interface part 40 and are packed into 8-bit packets, each of which is packed during 4 clock cycles timed at a negative edge and a positive edge of each clock cycle per data pad (DQA0–DQA7, DQB0–DQB7). Even bits (i.e., 0, 2, 4, 6) of the 8-bit data packeted during 4 clock cycles, for example, are transferred to a data input/output part 30 via an interface part 40 at an ascending edge of a clock signal tclk. Odd bits (i.e., 1, 3, 5, 7), for example, are transferred to the data input/output part 30 via the interface part 40 at a descending edge of a clock signal tclk.

The 8-bit data transferred via the interface part 40 are transformed to parallel data of 8 bits WD<0:7> through a data input shift part (not shown in the drawing) of the data input/output part 30, transferred to the core cell region 10 via a column control part 20, and written in a packet form. During a read operation, an 8-bit packet RD<0:7> is read from the core cell region 10, transferred to the data input/output part 30 via the column control part 20. The data input/output part 30 transforms data in packet form to an even-bit part and an odd-bit part via shift registers 31–34. Multiplexer and the drivers 41–44 of the interface part 40 transfer even data bits eread<0, 2, 4, 6> to data pads at an ascending edge of each clock signal tclk and Odd data bits oread<1, 3, 5, 7> to data pads at a descending edge of a clock signal tclk. Accordingly, 8 bits are transferred from a packet form to a serial form via respective data pads (DQA0–DQA7, DQB0–DQB7) during 4 clock cycles.

A prior memory device having a data pass structure as described above prefetches data by 8 bits from the core cell region 10, and then outputs the data at the ascending edge and the descending edge of each of the four clock cycles via a shift register of the data input/output part 30.

Such a prior memory device having a data pass structure as described above checks the output of every individual output data pad and detects a failure of the memory device in a DA test mode. Since each data output pad is separately associated with each output data pin it is not efficient for testing purposes. For example, if the number of pins allocated for outputting data of a tester is N and when the number of data output pads of a device is 16, the maximum number of devices that can be tested simultaneously is N/16.

A prior memory device may also compare data read from the core cell region 10 via a read data comparing part, determines whether a failure of the memory device has occurred, and outputs the result (Error_out) via an output terminal SI01. However, although a prior memory device could discriminate whether a failure has occurred by comparing the read data, the problem is that in a wafer level test, one cannot determine where in the core cell region 10 the failure occurred. Hence, one has to seek to repair the cell.

SUMMARY OF THE INVENTION

The present invention solves the problem of the prior art. It is an object of the present invention to provide a method for compressing output data to reduce testing time and a packet command driving type memory device with a pre-fetched data output structure.

It is another object of the present invention to provide a method for compressing output data which captures an address in a cell region where a failure has occurred in a memory device and a packet command driving type memory device with a pre-fetched data output structure.

It is another object of the present invention to provide a packet command driving type memory device that can output data selectively during a normal operation and a DA mode test through a circuit that can select an appropriate type of data to forward to a front stage of a shift register of a data input/output part. To achieve the object of the present invention, a method for compressing output data according to the present invention is characterized to write a first data with a certain number of bits in a corresponding address of core cell regions, read the first data written in the address as read data, compare the first data and the read data by dividing both the first data and the read data into an upper portion with a certain number of bits and a lower portion of remaining number of bits, generate compressed data of a single bit for each portion indicating whether a failure exists.

Also, a method for compressing output data according to the present invention comprises a step for reading data from a core cell region and prefetching the data of a first certain number of bits in a normal mode; a step for writing a first data of a certain number of bits in a corresponding address of the core cell region in a test mode; a step for reading the first data of the certain number of bits written in the address of the core cell region as read data and prefetching it; a step for comparing the first data of a certain number of bits and the read data of the certain number of bits by dividing them into an upper portion with a certain number of bits and a lower portion with the remaining number of bits; a step for compressing a first error signal of a certain number of bits to a 1-bit signal indicating whether a failure has occurred according to the comparing result and generating compressed data; a step for selecting the first data of a certain number of bits prefetched in a normal mode or the compressed data in a test mode according to a control signal; a step for shifting the selected data of a certain number of bits at an ascending edge and a descending edge of a clock signal and outputting individual bits of the selected data serially via a number of output pads in a normal mode; a step for shifting selected data of a certain number of bits at an ascending edge and a descending edge of a clock signal and outputting individual bits of the selected data serially via a corresponding one of a number of output pads in a test mode.

According to one exemplary embodiment, the number of bits of the first prefetched, the written, and the read data is 8. The upper portion contains 4 bits and the lower portion contains the remaining 4 bits. In a testing mode, the 4 bits of each of the upper and lower portions is compressed to 1 bit indicating whether a failure has occurred in the memory region when the corresponding 4-bit data is written and read.

In another embodiment of the present invention, a packet command driving type memory device comprises a read data comparing part for receiving and comparing a first data of a certain number of bits read from a core cell region and generating a compressed data; a data input/output part for shifting the compressed data or the data read from the core cell region via the read data comparing part and transforming it to an even-bit part and an odd-bit part according to a clock signal; an interface part for outputting the data read from the data input/output part according to the clock signal serially in a packet form via an output pad.

The read data comparing part comprises a number of comparators for receiving and comparing an upper or a lower 4-bit data of a prefetched 8-bit data according to a control signal and generating a 1-bit compressed data indicating whether a failure exists; a selecting means for selecting the prefetched 8-bit data in a normal mode and the compressed 8-bit data in a test mode according to the control signal. A comparator comprises a first to a fourth comparing means for receiving 4 bits of the first data and 4 bits of the read data and comparing corresponding single bits of the written data and the read data and generating a first to a fourth comparing signals according to the control signal; a generating means for receiving the first to the fourth comparing signal generated by the first to the fourth comparing means and generating a 1-bit compressed data indicating whether a failure has occurred.

A comparing means comprises a first NAND GATE for receiving corresponding 1-bit signal of the 4-bit first data and the control signal respectively; a second NAND GATE for receiving corresponding 1-bit signal of the 4-bit read data and the control signal; a third NAND GATE for receiving outputs of the first and the second NAND GATE; a first and a second NMOS transistor having gates and drains receiving the outputs of the first and the second NAND GATE; a first and a second PMOS transistor connected in series between a power voltage and a source of the first and the second NMOS transistor, having gates receiving the outputs of the first and the second NAND GATE; a third PMOS transistor having a gate receiving an output of the third NAND GATE and a source receiving a power voltage and the drains connected between sources of the first and the second NMOS transistor and drains of the first and the second PMOS transistor; generates the first to the fourth comparing signal respectively via sources of the first and the second NMOS transistor connected commonly and the drains of the first to the third PMOS transistor.

The generating means comprises a fourth NAND GATE for receiving the first to the fourth comparing signals generated by the first to the fourth comparing means and generating a 1-bit compressed data indicating whether a failure has occurred.

Furthermore, the present invention comprises a plurality of comparators, each for receiving and comparing data read from the core cell region with corresponding data written previously to the core cell region and generating a compressed data, receiving and comparing an upper or a lower 4-bits of an 8-bit prefetched data according to the control signal and generating a 1-bit compressed data indicating whether a failure exists; a selecting means for selecting the 8-bit prefetched data in a normal mode, and the compressed 8-bit data in a test mode according to the control signal.

A packet command driving type memory device according to the present invention comprises a read data comparing part having a plurality of comparators, each for receiving and comparing an upper or a lower 4 bits of an 8-bit prefetched data according to the control signal and generating a 1-bit comparing signal, a selecting means for selecting the 8-bit prefetched data in a normal mode and the compressed 8-bit data in a test mode according to the control signal; a data input/output part for shifting the selected data and transforming the selected data into an even-bit part and an odd-bit part according to a clock signal; an interface part for outputting the even-bit part and the odd-bit part from the data input/output part according to the clock signal serially via an output pad.

BRIEF DESCRIPTION OF THE INVENTION

FIG. 7A to FIG. 7H show operation wave forms when a packet command driving type memory device according to the present invention operates in a DA mode test.

DETAILED DESCRIPTION OF THE INVENTION

Hereinafter, a preferred embodiment of the present invention will be explained in more detail with reference to the accompanying drawings.

Figure 1:
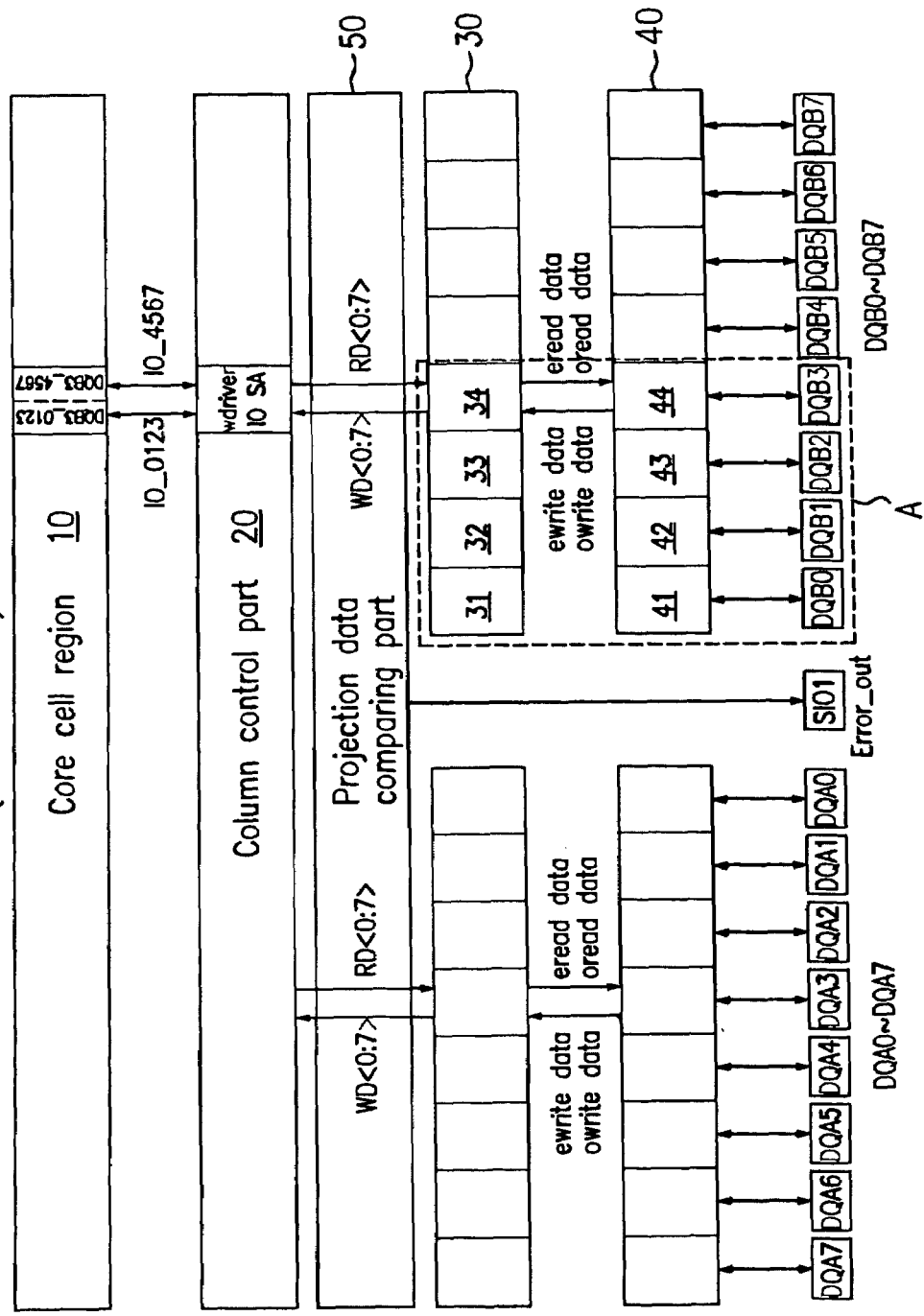
FIG. 1 shows a data pass structure in a packet command driving type memory device of the prior art.
Figure 2:
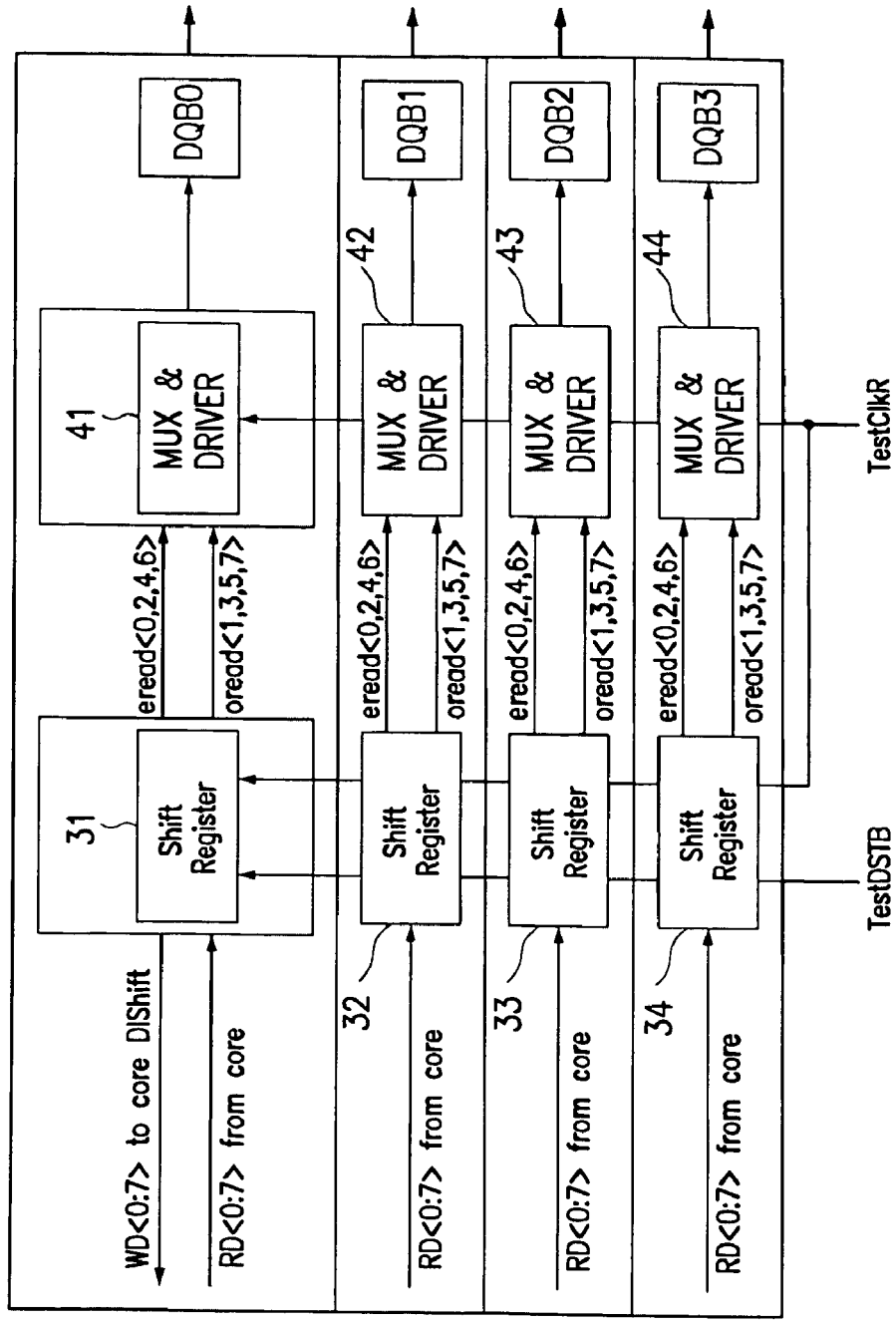
FIG. 2 shows a data pass between an interface part and a data input/output part in a packet command driving type memory device of FIG. 1.
Figure 3:
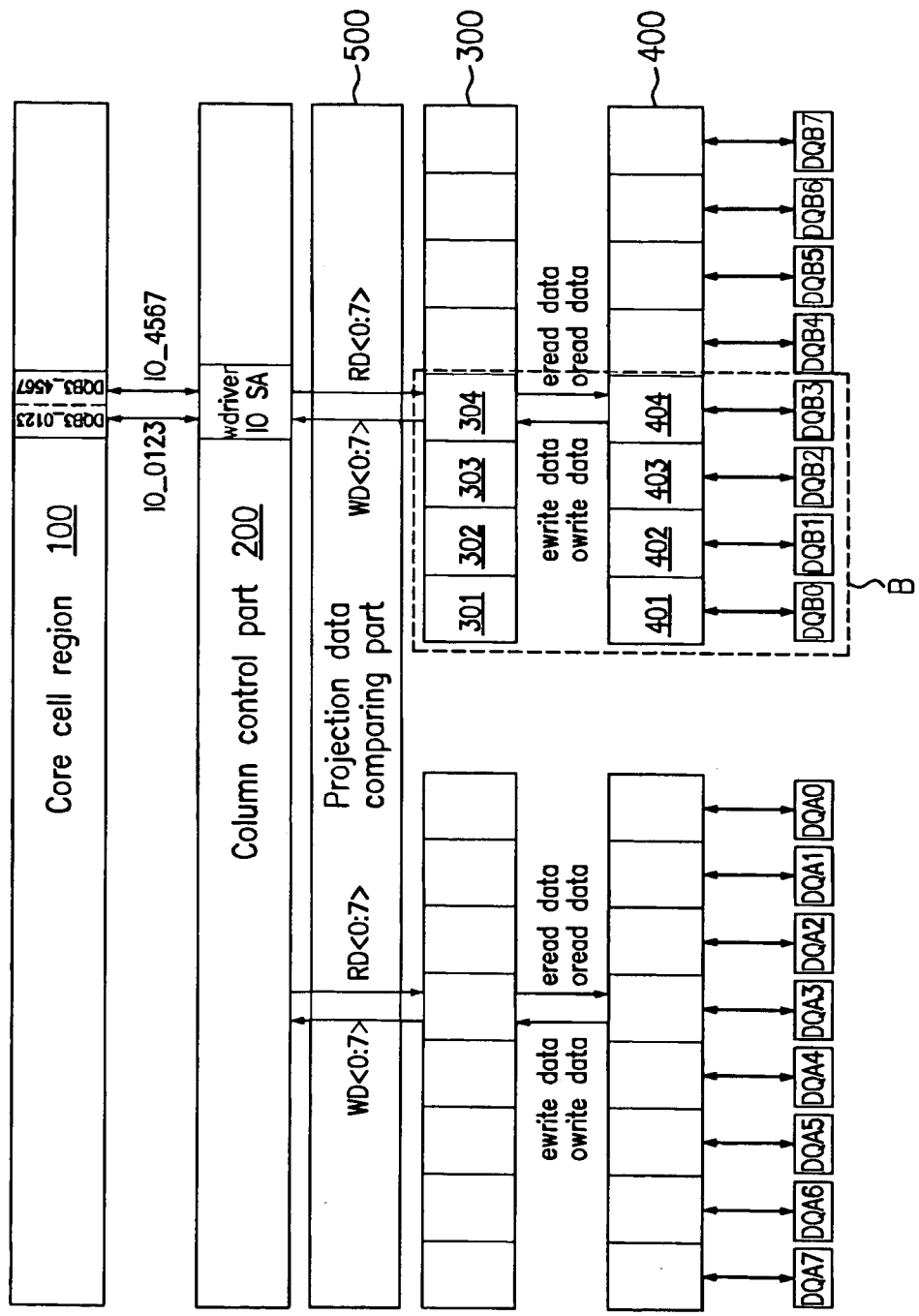
FIG. 3 shows a data pass structure between a read data comparing part and an interface part and a data input/output part in a packet command driving type memory device according to an embodiment of the present invention.

FIG. 3 shows a data pass structure between a read data comparing part, an interface part, and a data input/output part in a packet command driving type memory device according to an embodiment of the present invention. A data pass of a packet command driving type memory device according to an embodiment of the present invention comprises a core cell region 100, a column control part 200, a data input/output part 300, an interface part 400, a plurality of data pads (DQA or DQB) and a read data comparing part 500 that outputs data read in a normal mode or compressed error data indicating failure when it is a DA mode test and is arranged between the column control part 200 and the data input/output part 300.

Figure 4:
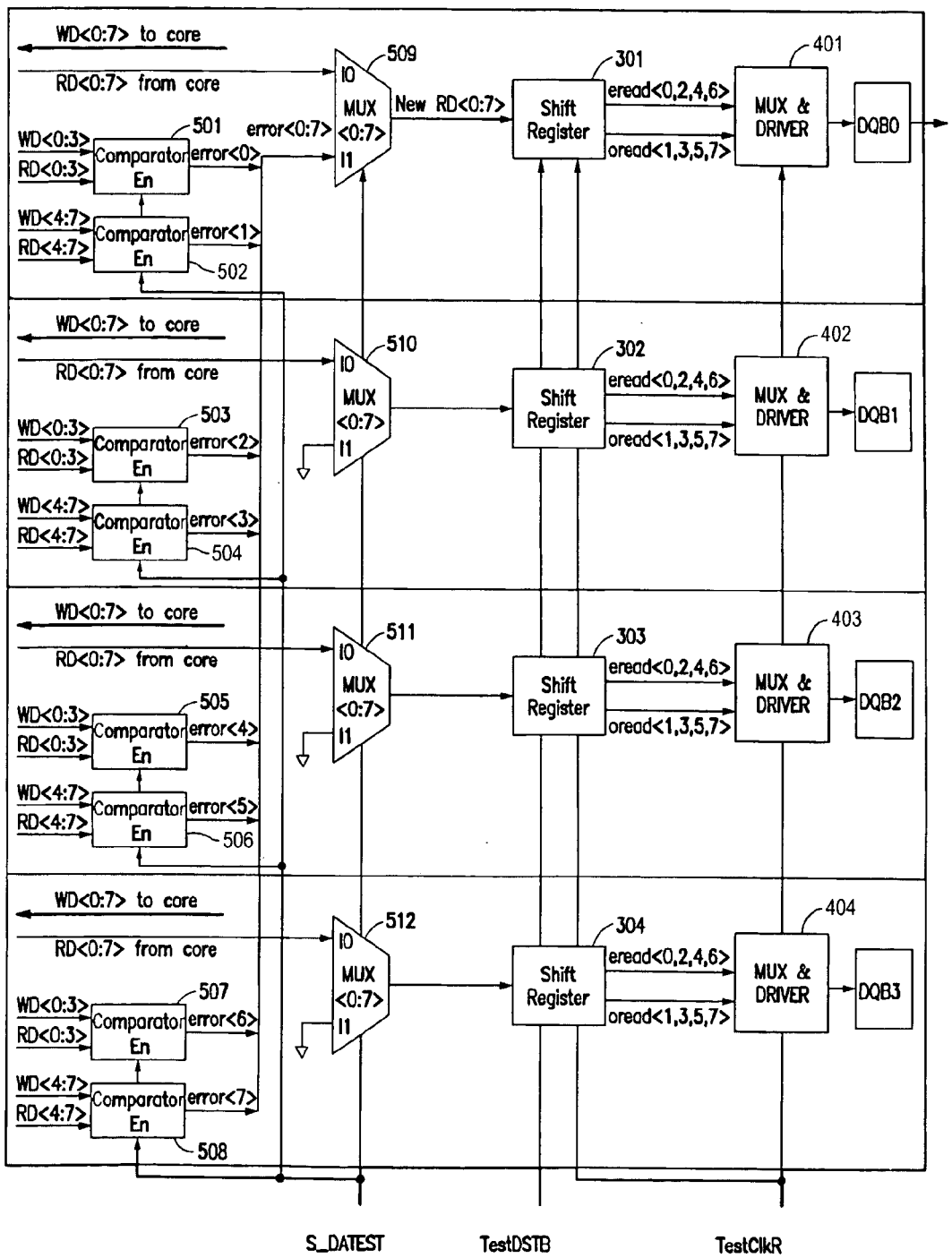
FIG. 4 shows a data pass between a read data comparing part and an interface part and a data input/output part in a packet command driving type memory device of FIG. 3.

FIG. 4 shows part B (a dotted line part) in the data pass structure of FIG. 3 in detail, that shows a pass that data from the core cell region 100 can be selectively outputted via the read data comparing part 500 to an output pad (DQ) during a normal operation or a DA mode test.

Referring to FIG. 4, in a memory device according to an embodiment of the present invention, the read data comparing part 500 comprises a number of comparators 501–508 for receiving 8 bits data RD<0:7> read from the core cell region 100 according to a control signal (S_DATEST) when it is a DA mode test, compressing upper 4-bit data RD<0:3> and a lower 4-bit data RD<4:7> and generating a 1-bit data error<i>, 0<i<7, having information indicating whether a failure exists, multiplexers 509–512 for selecting the 8-bit data RD<0:7> read from the core cell region 100 when it is a normal mode or error <0:7> generated by the comparators 501–508 when it is a DA mode test according to the control signal (S_DATEST).

Hereinafter, a data pass operation of a memory device of this invention having the above-mentioned structure will be explained in more detail.

Figure 5:
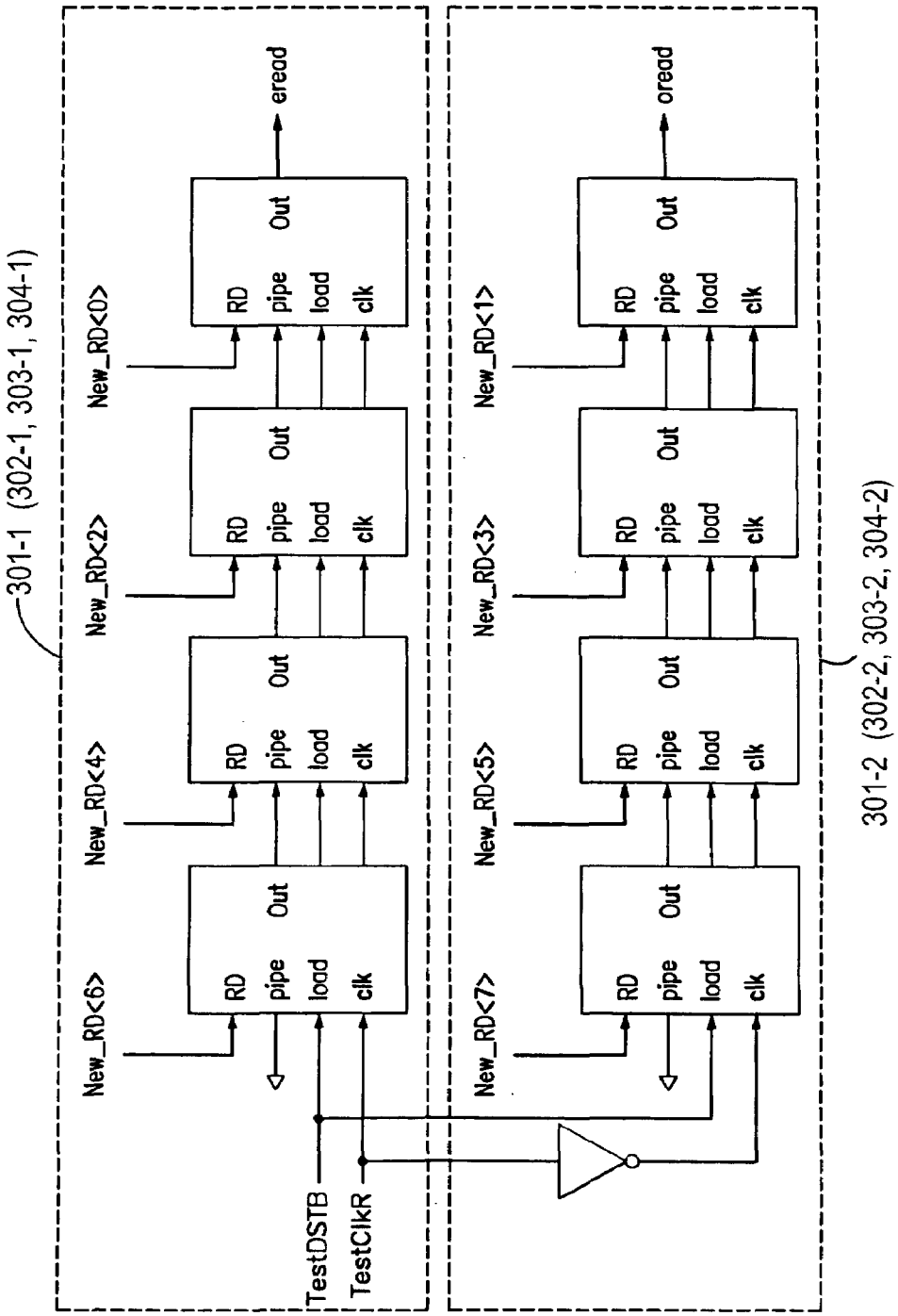
FIG. 5 shows a data output shift part in a data input/output part of FIG. 4.

First of all, a control signal (S_DATEST) in a low state is inputted from the outside when it is in a normal mode and thereby the comparators 501–508 are disabled, the multiplexers 509–512 select the 8-bit data RD<0:7> read from the core cell region 100 inputted to a first input terminal 10 of the multiplexer 509–512 according to the control signal (S-DATEST). Data New RD<0:7> outputted from the multiplexers 509–512 are transformed to an even-bit part and an odd-bit part via shift registers 301–304 of the data input/output part 300. FIG. 5 shows respective shift registers 301–304 in detail. Even data bits New RD<0, 2, 4, 6> of the New RD<0:7> transferred via the multiplexers 509–512 are shifted via shift registers 301-1, 302-1, 303-1, 304-1 according to a clock signal. Odd data bits New RD<1, 3, 5, 7> are shifted via shift registers 301-2, 302-2, 303-2, 304-2.

Data transformed via shift registers 301–304 are synchronized to a clock signal TestClkR via a plurality of multiplexers and drivers 401–404 of the interface part 400 and outputted serially via respective output pads (DQA0–DQA7 or DQB0–DQB7).

That is, since even data bits transferred via each shift register at an ascending edge of the clock signal TestClkR and odd data bits are transferred at a descending edge of the clock signal TestClkR, 8-bit data are transferred serially in a packet form via respective output pads (DQA0–DQA7 or DQB0–DQB7) during 4 clock cycles.

On one hand, as the control signal (S_DATEST) changes to a high state when it is a DA mode test and inputted to an enable terminal (EN) of data comparators 501–508, the data comparators 501–508 are enabled. The data comparators 501–508 receive 8-bit data read and prefetched from the core cell region 100. Each data comparator receives 4 bits and compresses them and generates a compressed 1-bit data error <i>, i≦i≦7, each indicating whether a failure has occurred.

Specifically, the comparators 501, 503, 505, 507 receive upper 4 bits RD<0:3> of 8-bit data read from the core cell region 100 respectively and each generates a 1-bit compressed data, namely, error<0>, error<2>, error<4>, and error <6>. The comparators 502, 504, 506, 508 receive lower 4 bits RD<4:7> of 8-bit data respectively and each generates a 1-bit compressed data, namely error <1>, error <3>, error <5>, and error <7>. A comparing block is defined to include 2 adjacent comparators (e.g., comparators 501 and 502, comparators 503 and 504, comparators 505 and 506, comparators 507 and 508), one for upper 4 bits and one for lower 4 bits. The 4 comparing blocks of the read data comparing part 500 are arranged corresponding to the respective shift registers 301–304 of the data input/output part 300. With this configuration, four 8-bit data packets are read respectively, compared with corresponding 8-bit written data by adjacent 4 comparing blocks of the read data comparing part 500 as shown in FIG. 4, thereby each comparator generates a 1-bit compressed data. Accordingly, 8 comparators in 4 comparing blocks generate a compressed 8-bit error data error<0:7> which is transformed to an even-bit part and an odd-bit part via the shift register 301.

As 2 comparators of each comparing block receive 8-bit data and generate 2 bits of compressed data, the received 8-bit data are divided into an upper 4 bits and a lower 4 bits, respectively, and each is compressed into 1 bit data error <i>, 0≦i≦1. In this manner, comparators 501, 502, 503, 504, 505, 506, 507, 508 in four comparing blocks generate 8-bit compressed data error <0:7>. Therefore, 32 bits of data are compressed into 8 bits error <0:7> and outputted through a second input terminal I1 of one of the multiplexers, e.g., the multiplexer 509.

The multiplexer 509 selects the error <0:7> compressed by the comparators 501–508 during a DA mode test according to the control signal (S-DATEST). That is, the data New RD<0:7> selected via the multiplexer 509 can be either error<0:7> or the read data RD<0:7>. The selected parallel data is forwarded to the shift register 301 where the data is transformed into an even-bit part and an odd-bit part and further converted into serial data via the multiplexer and driver 401 of the interface part 400 and outputted via a corresponding output pad DQB0. In a preferred embodiment, the second input terminal I1 of multiplexers 510–512 is grounded so that these multiplexers only select RD<0:7> when S-DATEST is low in a normal mode. The selected data by the multiplexers 510–512 are forwarded to shift registers 302–304, and multiplexers and drivers 402–404, respectively, which transform the selected data into serial data and output the serial data to the output pads DQB1, DQB2 and DQB3. That is, when S-DATEST is high, there is no data selected by multiplexers 510–512. When S-DATEST is low, these multiplexers select RD<0:7> (an 8-bit data packet read from the core cell region 100). Therefore, during a DA mode test, DQB1, DQB2, and DQB3 have no test output.

Accordingly, whether a failure has occurred is decided based on the 8-bit data outputted serially via the output pad DQB0 when it is a DA mode test.

FIG. 5 shows one example of a shift register, e.g., 301, of a data input/output part 300. Other shift registers 302–304 may be similarly constructed. The exemplary shift register 301 according to the present invention comprises a first shift register (e.g., 301-1) for even data bits for shifting even data bits of 8-bit data New RD<0:7> inputted via multiplexer 509 at an ascending edge of a clock signal TestClkR, a second shift register (e.g., 301-2) for odd data bits for shifting odd data bits of 8-bit data New RD<0:7> inputted via the multiplexers 509 in a descending edge of a clock signal TestClkR.

Figure 6:
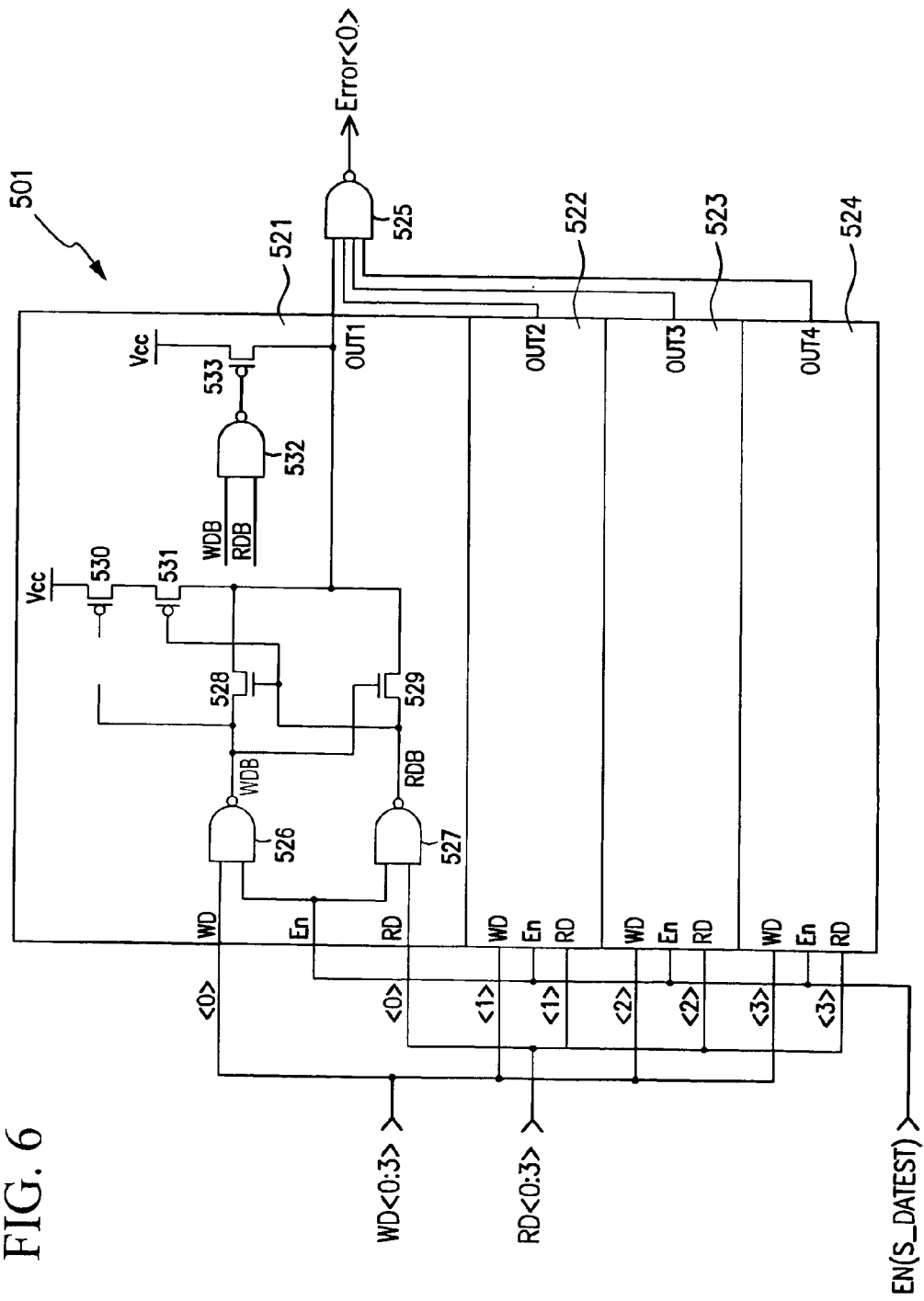
FIG. 6 shows a comparator in a read data comparing part of FIG. 4.
Figure 7A:
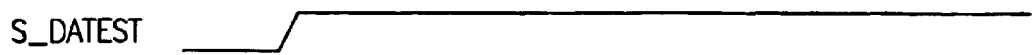
Figure 7B:
Figure 7C:
Figure 7D:

FIG. 6 shows an exemplary construct of a comparator (e.g., 501) in a memory device according to the present invention. In this exemplary embodiment, comparator 501 stores 4-bit data WD<0:3> in the core cell region 100 (not shown), reads back 4 written bits RD<0:3> immediately after a write operation and compares the read 4 bits RD<0:3> with the stored 4 bits WD<0:3>. Each of the comparators 502–508 compares a 4-bit stored data with a 4-bit read data. The 4-bit stored data can be either WD<0:3> or WD<4:7>. The 4-bit read data can be either RD<0:3> or RD<4:7>.

The comparator 501 includes a number of comparing means 521–524 for comparing 4 bits WD<0:3> or WD<4:7> of the written data WD<0:7> with 4 bits RD<0:3> or RD<4:7> of the read data RD<0:7>, each of the comparing means performs 1-bit comparison, respectively. The comparator 501 further includes a generating means 525 for receiving an output signal from each of the comparing means 521–524 and generating a 1-bit compressed data Error <0>, indicating whether a failure has occurred. Each of the comparing means 521–524 (e.g., 521) comprises a first NAND GATE 526 for receiving a corresponding 1-bit signal of the 4-bit written data WD<0:3> and a control signal (S_DATEST) as an enabling signal EN, a second NAND GATE 527 for receiving a corresponding 1-bit signal of the 4-bit read data RD<0:3> and the same control signal (S_DATEST) as an enabling signal EN, a second NAND GATE 527 for receiving a corresponding 1-bit signal of the 4-bit read data RD<0:3> and the same control signal (S_DATEST) as an enabling signal EN, a first NMOS transistor 528 with a gate receiving the output of the second NAND GATE 527 and a drain receiving the output of the first NAND GATE 526, a second NMOS transistor 529 with a gate receiving the output of the first NAND GATE 526 and a drain receiving the output of the second NAND GATE 527, a first and a second PMOS transistor 530, 531 connected serially between a power voltage Vcc and the sources of the first and the second NMOS transistors 528 and 529, and with their gates receiving the output signals of the first and the second NAND GATE 526, 527, respectively, a third NAND GATE 532 for receiving the output signals of the first and the second NAND GATE 526, 527, a third PMOS transistor 533 with a gate receiving an output of the third NAND GATE 532, a source receiving a power voltage, a drain connected to the sources of the first and second NMOS transistor 528, 529 and drains of the first and the second PMOS transistor 530, 531.

Each of the comparing means 521–524 generates a comparing signal output at the sources of the first and the second NMOS transistor 528, 529 and the drains of the first to the third PMOS transistor 530, 531, 533. Specifically, the comparing means 521 generates a first comparing signal OUT1; the comparing means 522 generates a second comparing signal OUT2; the comparing means 523 generates a third comparing signal OUT3; and the comparing means 524 generates a fourth comparing signal OUT4. The generating means 525 receives these four comparing signals OUT1–OUT4 and generates a 1-bit compressed data ERROR<0> signaling whether a failure has occurred. Hereinafter, an operation of each comparator of the present invention having a construction as described above will be explained.

When the 1-bit read data RD<0> and 1-bit written data WD<0> inputted to the comparator 521 are the same, for example, both being '0', the outputs of the first and the second NAND GATE 526, 527 are high, turning on the first and the second NMOS transistor 528, 529. The output of the NAND GATE 532 receiving the outputs of the first and the second NMOS transistor 528, 529 as input becomes low, thereby turning on the PMOS transistor 533. When all the comparing means 521–524 output comparing signals OUT1–OUT4 are high, the compressed data error <0> produced by the NAND GATE 525 is low.

Similarly, when the 1-bit read data RD<0> and the 1-bit written data WD<0>, inputted to the comparator 521, are both '1', the outputs of the first and the second NAND GATE 526, 527 are high. In this case, the first and the second NAND NMOS transistor 528, 529 are turned off and the PMOS transistors 530, 531 are turned on. When all 4 bits in RD<0:3> have the same value as the 4 bits in WD<0:3>, i.e., the first to the fourth comparing signal OUT1–OUT4 from the comparing means 521–524 are all high, making the compressed error <0> low. When the 1-bit read data (e.g., RD<0>, and 1-bit written data, e.g., WD<0>, are different from each other, for example, RD<0>=0, WD<0>=1, the first NMOS transistor 528 is turned off and the second NMOS transistor 529 is turned on. When the 1-bit written data WD<0> is low and the 1-bit read data RD<0> is high, the first NMOS transistor 528 is turned on and the second NMOS transistor 529 is turned off. When 528 and 529 have different states (one is on and one is off), the third PMOS transistor 533 is turned off and the first PMOS transistor 530 and the second PMOS transistor 531 are not turned on. In this case, OUT1 is low.

Accordingly, when any of the comparing means 521–524 of the comparator 501 generates a low comparing signal, the 1-bit compressed output error <0> generated by the NAND GATE of the corresponding generating means 525 becomes high.

Similar operational scheme applies to other comparators 502–508. That is, each comparator has four comparing means (similar to 521–524) and each of the comparing means of each comparator compares 1 written bit with 1 read bit by performing a logic operation, such as an Exclusive NOR GATE, generating a high state signal when two inputs (i.e., the 1 written bit and the 1 read bit) are the same, a low state signal when two inputs are different from each other. Then the corresponding NAND GATE (similar to 525) in each comparator will generate a low output when all 4 bits read match the 4 written bits and a high output when any of the 4 read bits fails to match the corresponding written bit.

The exemplary embodiment described in FIG. 4 includes 4 blocks of comparators (i.e., 501 and 502, 503 and 504, 505 and 506 and 507 and 508). Each of the comparators in a single block compares either upper or lower 4 bits of an 8-bit packet written in the core cell region 100 with the corresponding upper or lower 4 bits of the 8-bit data read from the core cell region 100 and generates a 1-bit compressed data error <i>, $0 \leq i \leq 7$, each indicating whether a failure has occurred at the memory location where the corresponding 4 bits in error are stored. Each of the 8-bit error data error<0:7> indicates the error status of a 4-bit data. Hence the error<0:7> is compressed, compared with the original data and can be outputted to a single output pad such as the DQB0 pad. That is, if a particular bit in the compressed data error <0:7> is low, it means that the core cell region or address where 4 bits of the underlying tested data are stored and read from that correspond to the particular 1 bit compressed data operated correctly. If the 1 bit compressed data is high, it means that the core cell region corresponding to the 1 bit compressed data operated incorrectly, hence a failure occurred at that specific memory location.

For example, in the case that error<0> is high, it means that a failure occurred at an address in the core cell region 100 where 4-bit data corresponding to error<0> are read. When error<7> is high, it means that a failure occurred at an address in the core cell region 100 corresponding to where 4-bit data corresponding to error<7> are read. Such determination is possible because, according to the present invention, when each 8-bit data is written to a predetermined address in the core cell region 100, the 8-bit data being written is read back from the address of the core cell region 100. Compared, via two comparators in a comparing block (each for 4 bits) with corresponding 4 bits of the written data, and a 1 bit compressed error data is generated based on the comparison result from which one can determine exactly where in the memory cell region 100 a failure occurred. Although the circuitry of storing 8-bit written data is not explicit in the drawings, this function facilitates the comparison with the 8-bit data RD<0:7> read from the core cell region 100.

As explained in detail above, since the memory testing method according to the present invention compresses error data (e.g., 4 to 1 compression), it is possible to test a large number of devices, hence, to reduce both testing time as well as cost for testing. In addition, since it is known exactly where in the core cell region 100 a failure has occurred based on the compressed error data, the repair of the faulty memory is made easier.

Although the present invention is illustrated in exemplary embodiments, it should be appreciated by one skilled in the art that the present invention can be realized by a variety of implementations without departing from the invention.

What is claimed is:

1. A method for compressing output data comprising:
reading a first data from a core cell region and prefetching the first data having a first number of bits in a normal mode;
writing the first data of the first number of bits into an address of the core cell region in a test mode;
reading the first data written into the address of the core cell region and prefetching the read data;
comprising the first data and the read data by dividing each of the first data and the read data into an upper portion having a second number of bits and a lower portion having a remaining member of bits; and
compressing a result from the comparing to generate a compressed dam with information indicating whether a failure is present;
selecting a selected data from the prefetched first data in a normal mode and the compressed data in a test mode;
shifting the selected data at an ascending edge and a descending edge of a clock signal and outputting the selected data serially via one or more output pads in a normal mode;
shifting the selected data at an ascending edge and a descending edge of the clock signal and outputting the selected data serially via one of the one or mole output pads in a test mode, wherein
the first number of bits associated with the prefetched first data, first data, and the read data is 8;
the second number of bits associated with the upper portion is 4;
the remaining number of bits associated with the lower portion is 4; and
the compressed data is 1-bit signal.

2. A packet command drip type memory device comprising:
a read data comparing part capable of receiving a first data and a read dam from a core cell region, both the first data and the read data having a first number of bits, comparing the first data with the tea data and generating a compressed data having a second number of bits;
a data input/output pan capable of transforming the compressed data and the read data to produce more than one data part;
an interface part capable of serially outputting the data pans from the data input/output part in a packet form via an output pad, wherein
the first number of bits associated with the first data and the read data is 8;
the first data and the read data are divided into, during said comparing, an upper 4 bit portion and a lower 4-bit portion;
the second number of bits associated with the compressed data is 2 bits, the read data comparing part compressing the upper 4 bit portions of the first data and the read data into a first 1-bit signal of the compressed data and the lower 4-bit portions of the first data and the read data into a second 1-bit signal of the compressed data; and
the data parts include an even-bit data part and an odd-bit data part.

3. A packet command driving type memory device comprising:
a read data comparing part capable of receiving a first data and a read data from a core cell region, both the first data and the read data having a first number of bits comparing the first data with the read data, and generating a compressed data having a second number of bits;
a data input/output part capable of transforming the compressed data and the read data to produce more than one data part;
an interface part capable of serially outputting the data parts from the data input/output part in a packet form via an output pad, wherein the read data comparing part comprises:
plurality of comparators, each of which capable of receiving and comparing corresponding portions of the first data and the read data to generate a 1-bit compressed data indicating whether a failure is present; and
a selecting means capable of selecting the read data in a normal mode and the compressed data generated by one of tee plurality of comparators in a test mode.

4. The packet command driving type memory device as in claim 3, wherein each of the plurality of comparators comprises:
a first comparing means capable of receiving a first bit of a 4-bit portion of the first data and a first bit of a 4-bit portion of the read data and comparing the received two first bits to generate a first 1-bit comparing signal;
a second comparing means capable of receiving a second bit of the 4 bit portion of the first data and a second bit of the 4-bit portion of the read data and comparing the received two second bits to genera a second 1-bit comparing signal;
a third comparing means capable of receiving a third bit of the 4 bit portion of the first data and a third bit of the 4 bit portion of the read data and comparing the received two third bits to generate a third 1-bit comparing signal;
a fourth comparing means capable of receiving a fourth bit of the 4-bit portion of the first data and a fourth bit of the 4-bit portion of the read data and comparing the received two fourth bits to generate a fourth 1-bit comparing sigal; and
a generating means capable of receiving the first, the second, the third, and the fourth comparing signals and producing the 1-bit compressed data.

5. The packet command driving type memory device as in claim 4, wherein each of the first, the second, the third, and the fourth comparing means comprises:
a first NAND GATE capable of receiving a 1-bit signal of the first data;
a second NAND GATE capable of receiving a corresponding 1-bit signal of the read 4 data;
a third NAND GATE capable of receiving outputs of the first and the second NAND GATE;
a first and a second NMOS transistor having gates and drains receiving the outputs of the first and the second NAND GATE;
a first and a second PMOS transistor connected in series between a power voltage and a source of the first and the second NMOS transistors, having gates to receive the outputs of the first and the second NAND GATE;
a third PMOS transistor having a gate to receive an output of the third NAND GATE and a source to receive a power voltage and a drain connected between sources of the first and the second NMOS transistors and a drain of the second PMOS transistor; wherein
the first, the second, the third, and the fourth comparing signals are generated via sources of the first and the second NMOS transistors and drains of the first to the third PMOS transistors.

6. The packer command driving type memory device as in claim 4, wherein the generating means comprises a fourth NAND GATE receiving the first, the second, the third, and the fourth comparing signals as input and generating the 1-bit compressed data as output.

7. A packet command driving type memory device comprising:
- plurality of comparators for receiving and comparing 8-bit data read from a core cell region and generating compressed data, wherein each of the comparators is capable of
- receiving 4 bits of an 8-bit first data and 4 bits of an 8-bit prefetched data read from an address of the core cell region where the first data is writ the received 4 bits of the first data being one of a 4-bit upper portion and a 4 bit lower portion of the first data and the received 4 bits of the prefetched data being one of a 4-bit upper portion and a 4-bit lower portion of the prefetched data,
- comparing the 4 bits of the first data and the 4 bits of the prefetched data in a test mode, and
- generating a 1-bit compressed data based on a result of the comparing with information indicating whether a failure is present; and
- a selecting means capable of selecting the 8-bit prefetched data in a normal mode and the compressed data from the plurality of comparators in the test mode.

8. A packet command driving type memory device comprising:
- a read data comparing pant having a plurality of comparators capable of
- receiving an 8-bit first data and an 8-bit prefetched data read from an address of a core cell region where the first dam is written,
- comparing tee received fast data with tae prefetched data by coming, via each of the plurality of comparators, corresponding upper and lower 4 bits of the 8-bit first data and the 8-bit prefetched data in a test mode, and
- generating, by each of the plurality of comparators, a 1-bit compressed data for each of the comparing performed based on corresponding 4 bits portions of the first data and the prefetched data,
- selecting a selected data from the 8-bit prefetched data in a normal mode and the compressed data from the plurality of compass in a test mode;
- a data input/output part capable of transforming the selected data into more than one data parts; and
- an interface part capable of serially outputting the data pas of the selected data from the data input/output part.

* * * * *